(12) United States Patent
Alhussien et al.

(10) Patent No.: US 11,698,864 B2
(45) Date of Patent: *Jul. 11, 2023

(54) MEMORY ACCESS COLLISION MANAGEMENT ON A SHARED WORDLINE

(71) Applicant: Micron Technology, Inc., Boise, ID (US)

(72) Inventors: Abdelhakim Alhussien, San Jose, CA (US); Jiangang Wu, Milpitas, CA (US); Karl D. Schuh, Santa Cruz, CA (US); Qisong Lin, El Dorado Hills, CA (US); Jung Sheng Hoei, Newark, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/824,676

(22) Filed: May 25, 2022

(65) Prior Publication Data

US 2022/0283952 A1 Sep. 8, 2022

Related U.S. Application Data

(63) Continuation of application No. 16/817,384, filed on Mar. 12, 2020, now Pat. No. 11,366,760.

(51) Int. Cl.
*G06F 12/00* (2006.01)
*G06F 12/0882* (2016.01)
*G06F 12/02* (2006.01)
*G11C 11/408* (2006.01)
*G06F 9/30* (2018.01)
*G06F 9/4401* (2018.01)

(52) U.S. Cl.
CPC ...... *G06F 12/0882* (2013.01); *G06F 9/30047* (2013.01); *G06F 9/30098* (2013.01); *G06F 9/4418* (2013.01); *G06F 12/0246* (2013.01); *G11C 11/4085* (2013.01)

(58) Field of Classification Search
None
See application file for complete search history.

(56) References Cited

U.S. PATENT DOCUMENTS 5,471,602 A 11/1995 DeLano
9,021,158 B2 4/2015 Hyun et al.
(Continued)

OTHER PUBLICATIONS

International Search Report and Written Opinion for International Application No. PCT/US2021/021956, dated Jun. 18, 2021, 11 pages.

*Primary Examiner* — Daniel D Tsui
(74) *Attorney, Agent, or Firm* — Lowenstein Sandler LLP (57) ABSTRACT

A processing device in a memory sub-system sends a program command to the memory device to cause the memory device to initiate a program operation on a corresponding wordline and sub-block of a memory array of the memory device. The processing device further receives a request to perform a read operation on data stored on the wordline and sub-block of the memory array, sends a suspend command to the memory device to cause the memory device to suspend the program operation, reads data corresponding to the read operation from a page cache of the memory device, and sends a resume command to the memory device to cause the memory device to resume the program operation.

20 Claims, 8 Drawing Sheets

(56) References Cited

U.S. PATENT DOCUMENTS

| | | |
|---|---|---|
| 9,036,428 B1 | 5/2015 | DAbreu |
| 9,941,014 B2 | 4/2018 | Lee |
| 2012/0179860 A1 | 7/2012 | Falanga et al. |
| 2013/0094313 A1* | 4/2013 | Sullivan ............... G11C 7/1075 |
| | | 365/195 |
| 2014/0082321 A1 | 3/2014 | Lee et al. |
| 2015/0117104 A1 | 4/2015 | Senoo |
| 2017/0032829 A1 | 2/2017 | Hong et al. |
| 2018/0158527 A1 | 6/2018 | Confalonier et al. |
| 2019/0042137 A1 | 2/2019 | Wysocki |

* cited by examiner

MEMORY ACCESS COLLISION MANAGEMENT ON A SHARED WORDLINE

RELATED APPLICATIONS

This application is a continuation of U.S. patent application Ser. No. 16/817,384, filed Mar. 12, 2020, the entire contents of which are hereby incorporated by reference herein.

TECHNICAL FIELD

Embodiments of the disclosure relate generally to memory sub-systems, and more specifically, relate to memory access collision management on a shared wordline.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to memory access collision management on a shared wordline on a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

In certain memory sub-systems it is quite common to receive a request to perform a memory access operation, such as a program operation of data from a host system, and then to subsequently receive a request to perform another memory access operation, such as a read operation on that same data from the host system right away, possibly even before the program operation has been completed. Conventional memory sub-systems sometimes keep the data being programmed in controller memory (e.g., dynamic random access memory (DRAM)) while the underlying memory device (e.g., negative-and (NAND) type flash memory) of the memory sub-system is being programmed, and then flush the controller memory when the program operation is complete. As long as the programming time (i.e., the time associated with performing the program operation of the memory device) is relatively short, a controller memory of reasonable size can accommodate the program data. When the memory device uses certain types of memory cells, such as triple level cells (TLCs) or quad-level cells (QLCs), however, the programming times can increase significantly. As such, the size of the controller memory would also have to be increased in order to accommodate the program data for these longer periods of time. In many implementations, increasing the size of the controller memory sufficiently is prohibitively expensive. Accordingly, in many memory subsystems, the program data is discarded from the controller memory before the programming operation of the memory device is complete. Thus, if a subsequent request to perform a read operation is received while the program operation is still ongoing, conventional memory subsystems must wait until the program operation is complete before performing the read operation on the memory device. This can lead to significant latency in responding to requests from the host system.

Aspects of the disclosure address the above and other deficiencies by providing read and program collision management on a shared wordline on a memory device of a memory sub-system. In order to reduce latency in mixed workloads (e.g., a combination of program operations and read operations, such as a program operation followed immediately by a read operation), a suspend manager of a memory sub-system controller can use a program suspend command to allow read operations to access a page of a memory device on which a program operation is currently being performed. The program suspend command can cause the memory device to temporarily pause the program operation to allow access to the memory array. In particular, when the memory sub-system receives a request to perform a read operation of data stored in a page of the memory device while a program operation is in process on the same wordline and sub-block, the suspend manager can use the program suspend command.

In addition to the memory array, the memory device can further include a page cache or other buffer. Data being programmed is stored in the page cache while the data is written to the appropriate cells of the memory array. Furthermore, when a multi-pass programming scheme is used, certain page types of a given memory cell can be programmed at different times. For example, a quad-level cell (QLC) memory cell can have a total of four logical pages, including a lower logical page (LP), an upper logical page (UP), an extra logical page (XP) and a top logical page (TP), where each logical page stores a bit of data. Depending on the programming scheme, the LP can be programmed on one pass for example, and the UP, XP and TP can be programmed on a second pass. Other programming schemes are possible. In this example, however, prior to programming the UP, XP, and TP in the second pass, the data from the LP is first read from the memory cell and can be stored in the page cache of the memory device. Thus, upon suspending the program operation, the suspend manager can read the requested data corresponding to the read operation from the page cache and return that data to the host system without having to wait for the ongoing program operation to be completed.

Advantages of the present disclosure include, but are not limited to improved performance in the memory sub-system. The latency associated with a request received from a host system to perform a read operation can be significantly reduced, as the read operation need not wait until an ongoing program operation is completed. As such, a denser array of memory cells can be used to provide a memory sub-system with larger capacity without impacting the Quality of Service (QoS) experienced by the host system. In addition, any need for a larger controller memory (e.g. DRAM) is eliminated, thereby reducing cost and saving space within the memory sub-system.

Figure 1:
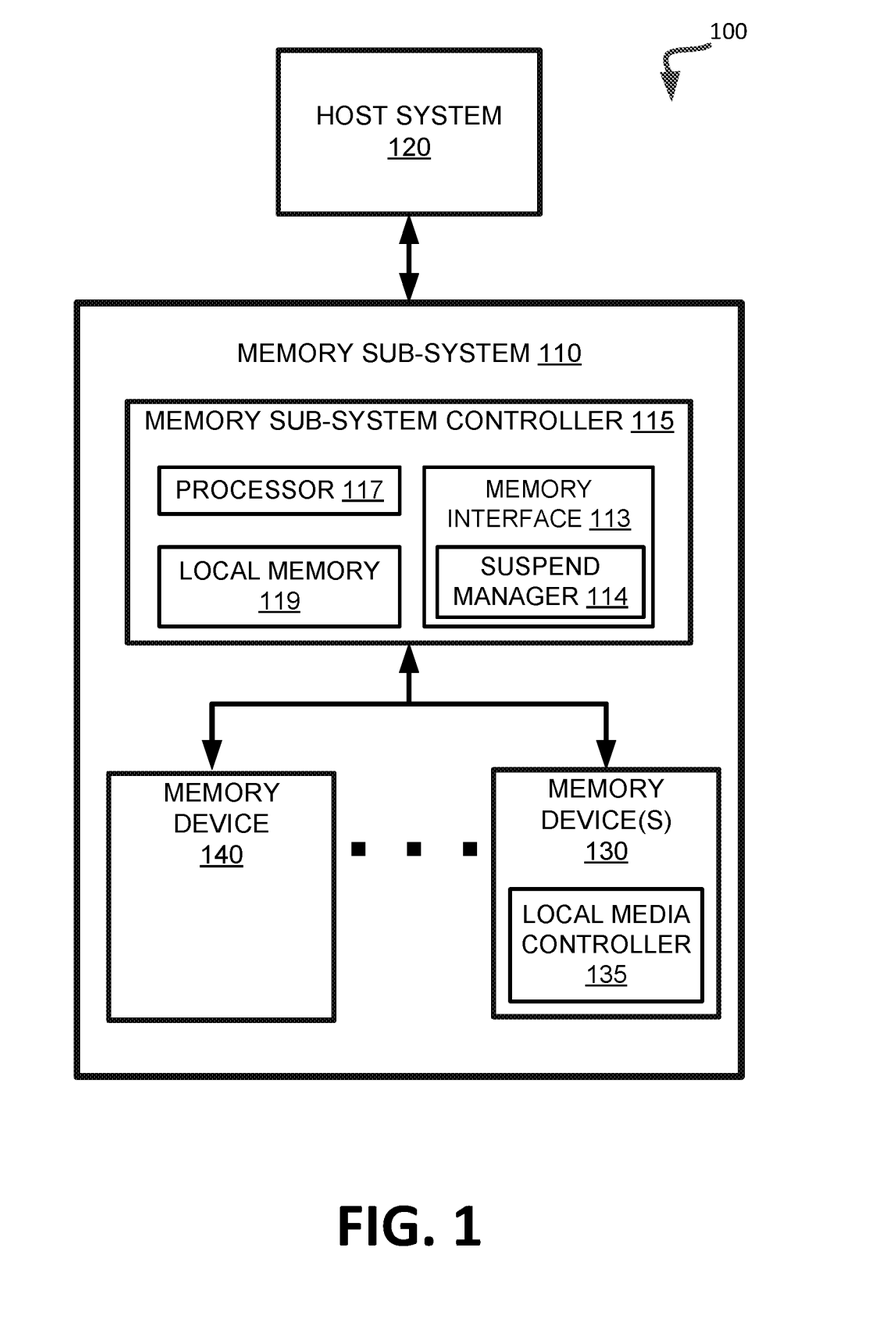
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a memory interface component 113 which includes suspend manager 114. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In one embodiment, memory interface 113 includes suspend manager 114, among other sub-components. Suspend manager 114 can manage read and program collisions on a shared wordline of memory device 130. A read and program collision can occur when a program operation is being performed on cells of a certain data block, sub-block, and wordline of memory device 130 when a request to perform a read operation on cells of the same data block, sub-block and wordline is received. In response to such a collision, suspend manager 114 can determine how to proceed. In one embodiment, suspend manager 114 can suspend the program operation by issuing a designated suspend command to memory device 130 and read data corresponding to the read operation from a page cache in memory device 130. In another embodiment, suspend manager 114 can issue a different command that transparently reads the page cache without suspending the program operation. In yet another embodiment, suspend manager 114 can issue another command that causes memory device 130 to determine whether the read operation is directed to the same wordline as the program operation, and if so, return the requested data from the page cache. If the read operation is directed to a different wordline, however, the memory device can automatically suspend the program operation and return the requested data from the memory array itself. Further details with regards to the operations of suspend manager 114 are described below.

In some embodiments, the memory sub-system controller 115 includes at least a portion of the memory interface component 113. For example, the memory sub-system controller 115 can include a processor 117 (processing device) configured to execute instructions stored in local memory 119 for performing the operations described herein. In some embodiments, the memory interface component 113 is part of the host system 110, an application, or an operating system.

Figure 2:
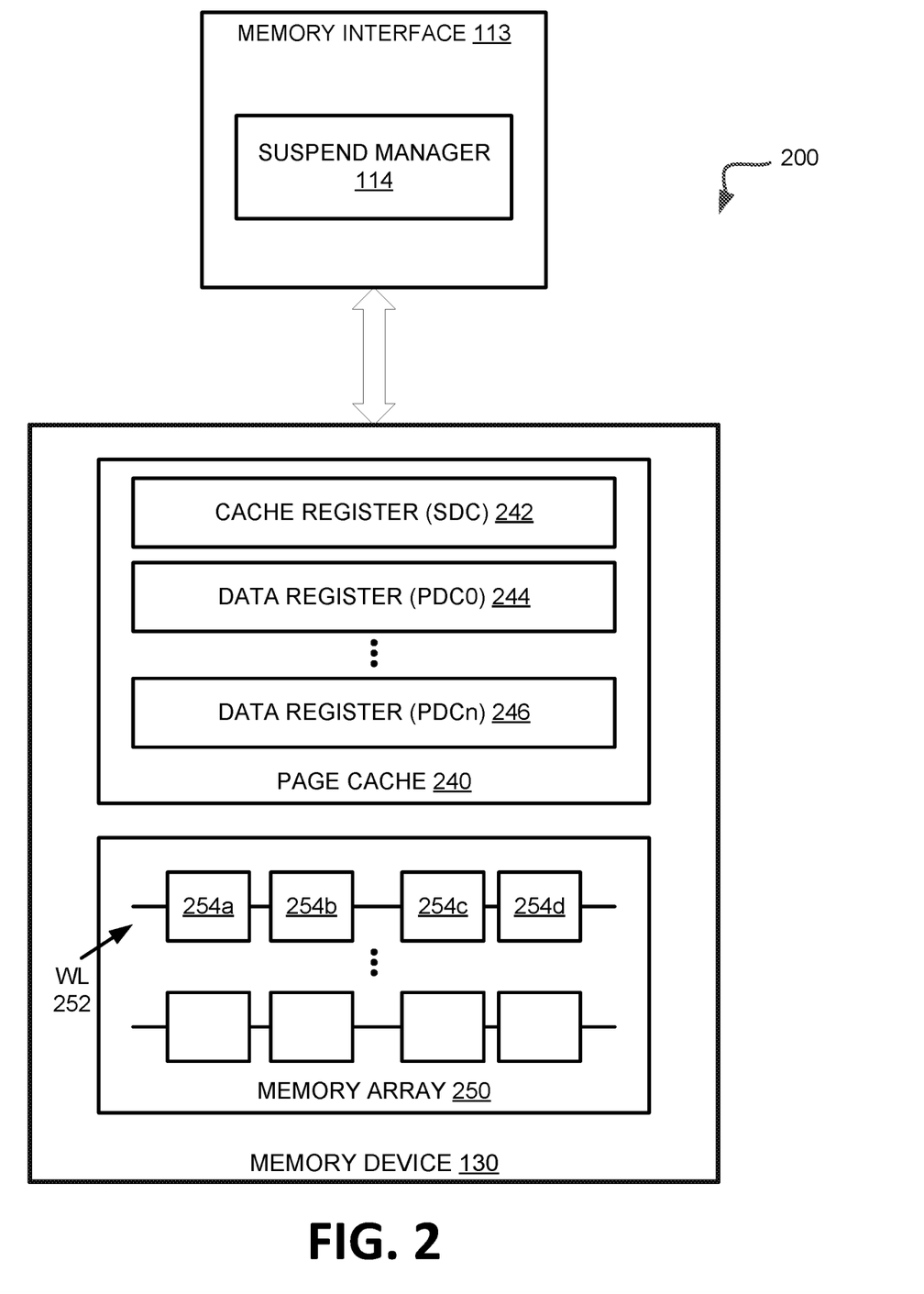
FIG. 2 is a block diagram illustrating read and program collision management on a shared wordline of a memory device in accordance with some embodiments of the present disclosure.

FIG. 2 is a block diagram 200 illustrating read and program collision management on a shared wordline of a memory device in accordance with some embodiments of the present disclosure. In one embodiment, memory interface 113 is operatively coupled with memory device 130. In one embodiment, memory device 130 includes a page cache 240 and a memory array 250. Memory array 250 can include an array of memory cells formed at the intersections of wordlines, such as wordline 252, and bitlines (not shown). In one embodiment, the memory cells are grouped in to blocks, which can be further divided into sub-blocks, where a given wordline, such as wordline 252, is shared across a number of sub-blocks 254a, 254b, 254c, 254d, for example. The group of memory cells associated with a wordline within a sub-block is referred to as a physical page. Each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible. In this example, however, prior to programming the UP, XP, and TP in the second pass, the data from the LP is first read from the physical page in memory array 250 and can be stored in the page cache 240 of memory device 130. The page cache 240 is a buffer used to temporarily store data being read from or written to memory array 250 of memory device 130, and can include a cache register 242 and one or more data registers 244-246. For a read operation, the data is read from memory array 250 into one of data registers 244-246, and then into cache register 242. Memory interface 113 can then read out the data from cache register 242. For a program operation, memory interface 113 writes the data to cache register 242, which is then passed to one of data registers 244-246, and finally programmed to memory array 250. If the program operation includes multiple pages (e.g., UP, XP, and TP), each page can have a dedicated data register to hold the corresponding page data.

Depending on the programming scheme, the LP can be programmed on one pass for example, and the UP, XP and TP can be programmed on a second pass. In this example, however, prior to programming the UP, XP, and TP in the second pass, the data from the LP is first read from memory array 250 and stored in one of data registers 244-246 in page cache 240. Suspend manager 114 can leverage the storage of this data in the page cache 240 in order to perform a read operation during an ongoing program operation. For example, upon suspending the program operation, suspend manager 114 can read the requested data corresponding to the read operation from page cache 240 and return that data to host system 110 without having to wait for the ongoing program operation to be completed.

Figure 3:
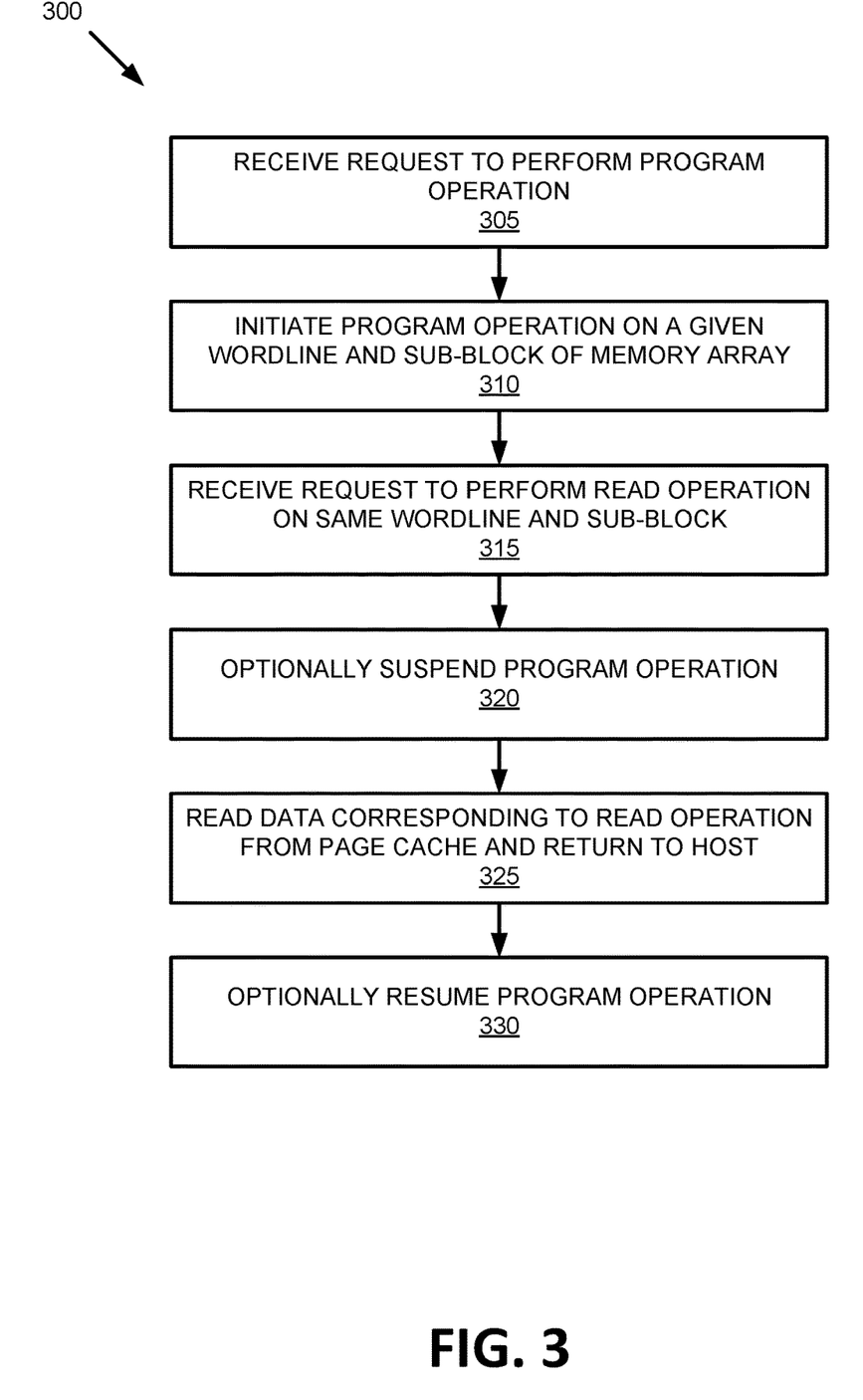
FIG. 3 is a flow diagram of an example method of read and program collision management on a shared wordline of a memory device in accordance with some embodiments of the present disclosure.

FIG. 3 is a flow diagram of an example method of read and program collision management on a shared wordline of a memory device in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by memory interface 113 and suspend manager 114 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic receives a request to perform a program operation on memory device 130. In one embodiment, memory sub-system controller 115 receives the request from host system 120 or from some other component connected to or within memory sub-system 110. The request may identify or include data to be written, programmed, or otherwise stored on memory device 130 of memory sub-system 110. In one embodiment, the program operation is a media management related program operation and is not initiated by host system 120.

At operation 310, the processing logic initiates the program operation memory device 130. In one embodiment, suspend manager 114, or some other component of memory interface 113, sends a program command to memory device 130 to cause memory device 130 to initiate the program operation on a corresponding wordline and sub-block of memory array 250. In one embodiment, in response to receiving the program command, memory device 130 identifies the corresponding wordline 252 and/or sub-block 254a, and reads one or more previously programmed pages from the wordline 252 and sub-block 254a. For example, if the LP was previously programmed, and the current program operation is associated with the UP, XP and TP of a memory cell, prior to programming the UP, XP, and TP in the second pass, memory device 130 can first read the data from the LP and store that data from the one or more previously programmed pages in one of data registers 244-246 in page cache 240.

At operation 315, the processing logic receives a request to perform a read operation on data stored on the same wordline and sub-block of the memory array. In one embodiment, memory sub-system controller 115 receives the request from host system 120 or from some other component connected to or within memory sub-system 110. The request may identify or include data to be read from memory device 130 of memory sub-system 110. In one embodiment, the read operation is a media management related read operation and is not initiated by host system 120.

At operation 320, the processing logic optionally suspends the program operation. In one embodiment, suspend manager 114 sends a suspend command to memory device 130 to cause memory device 130 to temporarily pause, halt, or otherwise stop execution of the on-going program operation. In one embodiment, the processing logic proceeds to operation 325 without suspending the program operation.

At operation 325, the processing logic reads data corresponding to the read operation from page cache 240 of memory device 130 and returns the data to the requesting host system 120. As described above, as part of the program operation, certain previously programmed data can be temporarily stored in page cache 240. When the requested data corresponding to the read operation includes at least a portion of the one or more previously programmed pages, suspend manager 114 can read that data directly from the page cache 240 without having to access memory array 250. In addition, the data being programmed as part of the program operation can also be temporarily stored in the page cache 240 while it is being written to the memory array. Thus, when the requested data corresponding to the read operation includes at least a portion of the data currently being programmed, suspend manager 114 can read that data directly from the page cache 240 as well.

At operation 330, the processing logic optionally resumes the program operation. In one embodiment, suspend manager 114 sends a resume command to memory device 130 to cause memory device 130 to resume, restart, or otherwise continue execution of the suspended program operation.

Figure 4:
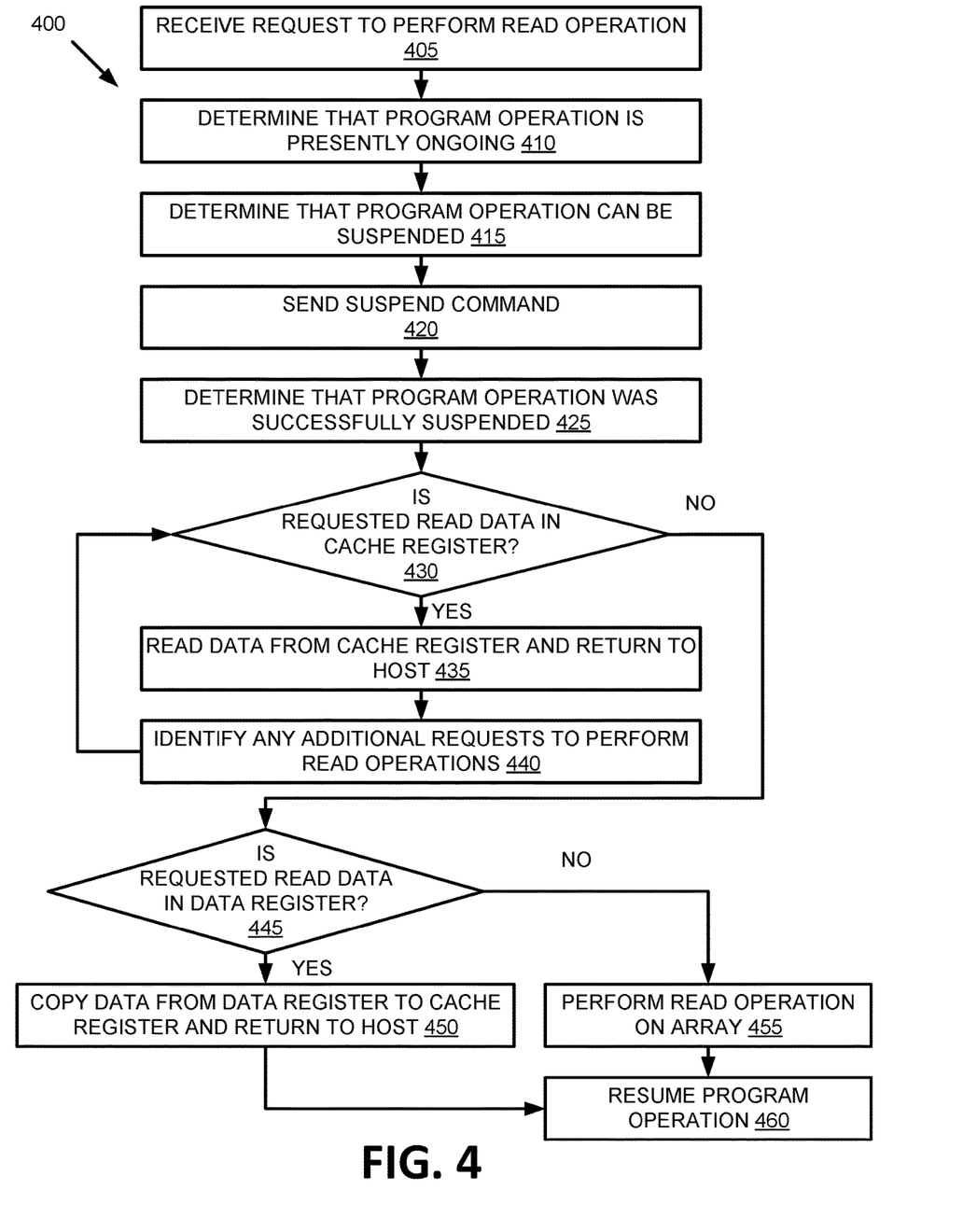
FIG. 4 is a flow diagram of an example method of read operation processing when a program operation on a shared wordline of a memory device is successfully suspended in accordance with some embodiments of the present disclosure.

FIG. 4 is a flow diagram of an example method of read operation processing when a program operation on a shared wordline of a memory device is successfully suspended in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by memory interface 113 and suspend manager 114 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic receives a request to perform a read operation on memory device 130. In one embodiment, memory sub-system controller 115 receives the request from host system 120 or from some other component connected to or within memory sub-system 110. The request may identify or include data to be read from memory device 130 of memory sub-system 110. In one embodiment, the read operation is a media management related read operation and is not initiated by host system 120. At operation 410, the processing logic determines that a program operation is presently ongoing on memory device 130.

At operation 415, the processing logic determines that the program operation can be suspended. In one embodiment, suspend manager 114 determines an expected program time associated with the program operation. The expected program time can be related to the type of memory cells being programmed. For example, SLC memory can be programmed very quickly compared to TLC or QLC memory. Accordingly, if the wordline 252 includes memory cells configured as SLC, suspend manager 114 may not suspend the program operation and can let the program operation finish execution since the expected program time is very short. If, however, the wordline 252 includes memory cells configured as TLC or QLC memory, suspend manger 114 can suspend the program operation since the expected program time is much longer.

At operation 420, the processing logic sends a suspend command to memory device 130. In one embodiment, suspend manager 114 sends a suspend command to memory device 130 to cause memory device 130 to temporarily pause, halt, or otherwise stop execution of the on-going program operation.

At operation 425, the processing logic determines that program operation was successfully suspended. Depending on how far along the program operation is when the suspend command is issued, the program operation may or may not be able to be suspended. For example, if a certain percentage of the program operation has completed, or if the program operation is within a certain threshold amount of time from being fully completed, memory device 130 may not be able to suspend the program operation or may choose not to suspend the program operation. Accordingly, in order for the program operation to be successfully suspended, the program operation must not satisfy the above criteria. In one embodiment, suspend manager 114 receives a confirmation message from memory device 130 indicating that the program operation was successfully suspended.

At operation, 430, the processing logic determines whether the requested data associated with the read operation is present in cache register 242 of page cache 240 of memory device 130. When data is programmed to memory device 130, that data can be first written to cache register 242, before being passed to one of data registers 244-246, and eventually programmed to memory array 250. Accordingly, if the read operation identifies data that was recently programmed to the memory device 130, that data may be available in cache register 242. In one embodiment, suspend manager 114 reads the data in cache register 242 to determine whether that data corresponds to the requested read data.

In response to determining that the data corresponding to the read operation is present in cache register 242, at operation 435, the processing logic reads the data corresponding to the read operation directly from cache register 242 and sends the data corresponding to the read operation to the host system 120. At operation 440, the processing logic identifies any additional requests to perform read operations on memory device 130 that are pending and can be processed while the program operation is suspended, and returns to operation 430 to perform those read operations.

In response to determining that the data corresponding to the read operation is not present in cache register 242, at operation 445, the processing logic determines whether the data corresponding to the read operation is present in one of data registers 244-246 of page cache 240. During a read operation, the requested data is read from memory array 250 into one of data registers 244-246, and then eventually into cache register 242. In addition, depending on the programming scheme, different pages of a memory cell can be programmed in different programming passes. Thus, prior to programming certain pages in a subsequent programming pass, data from other pages programmed in a prior programming pass is first read from memory array 250 and stored in one of data registers 244-246 in page cache 240. In one embodiment, the processing logic can read the data registers 244-246 to determine if the requested read data is present there.

In response to determining that the data corresponding to the read operation is present in one of data registers 244-246, at operation 450, the processing logic can copy the data corresponding to the read operation from the data register to cache register 242. Suspend manager 114 can read the requested data directly from cache register 242 and return the data to host system 120.

In response to determining that the data corresponding to the read operation is not present in one of data registers 244-246, at operation 455, the processing logic performs the read operation on memory array 250 of memory device 130. At operation 460, the processing logic resumes the program operation. In one embodiment, suspend manager 114 sends a resume command to memory device 130 to cause memory device 130 to resume, restart, or otherwise continue execution of the suspended program operation.

Figure 5:
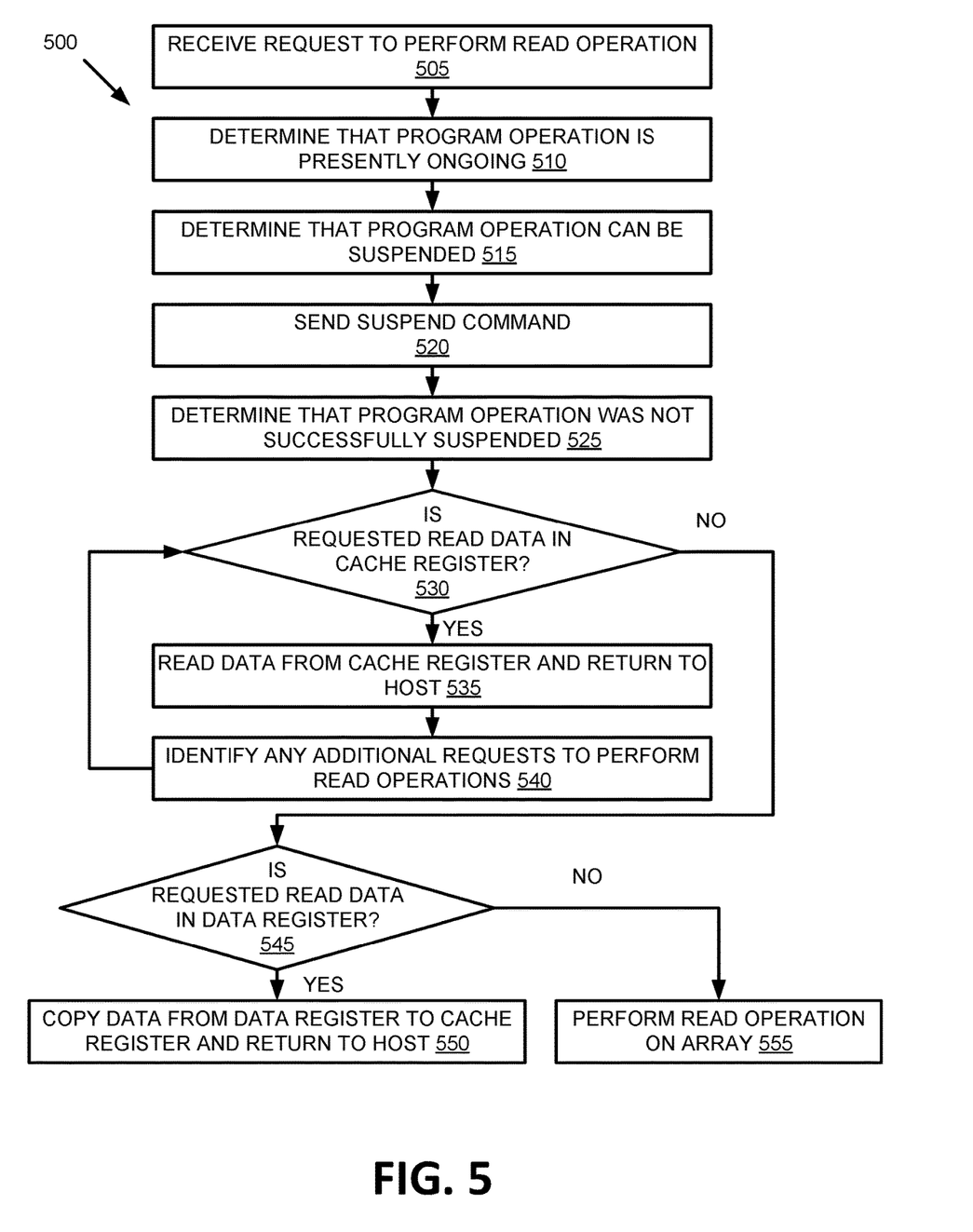
FIG. 5 is a flow diagram of an example method of read operation processing when a program operation on a shared wordline of a memory device is not successfully suspended in accordance with some embodiments of the present disclosure.

FIG. 5 is a flow diagram of an example method of read operation processing when a program operation on a shared wordline of a memory device is not successfully suspended in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by memory interface 113 and suspend manager 114 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic receives a request to perform a read operation on memory device 130. In one embodiment, memory sub-system controller 115 receives the request from host system 120 or from some other component connected to or within memory sub-system 110. The request may identify or include data to be read from memory device 130 of memory sub-system 110. In one embodiment, the read operation is a media management related read operation and is not initiated by host system 120. At operation 510, the processing logic determines that a program operation is presently ongoing on memory device 130.

At operation 515, the processing logic determines that the program operation can be suspended. In one embodiment, suspend manager 114 determines an expected program time associated with the program operation. The expected program time can be related to the type of memory cells being programmed. For example, SLC memory can be programmed very quickly compared to TLC or QLC memory. Accordingly, if the wordline 252 includes memory cells configured as SLC, suspend manager 114 may not suspend the program operation and can let the program operation finish execution since the expected program time is very short. If, however, the wordline 252 includes memory cells configured as TLC or QLC memory, suspend manger 114 can suspend the program operation since the expected program time is much longer.

At operation 520, the processing logic sends a suspend command to memory device 130. In one embodiment, suspend manager 114 sends a suspend command to memory device 130 to cause memory device 130 to temporarily pause, halt, or otherwise stop execution of the on-going program operation.

At operation 525, the processing logic determines that program operation was not successfully suspended. Depending on how far along the program operation is when the suspend command is issued, the program operation may or may not be able to be suspended. For example, if a certain percentage of the program operation has completed, or if the program operation is within a certain threshold amount of time from being fully completed, memory device 130 may not be able to suspend the program operation or may choose not to suspend the program operation. Accordingly, in order for the program operation to be successfully suspended, the program operation must not satisfy the above criteria. In one embodiment, suspend manager 114 receives a confirmation message from memory device 130 indicating that the program operation was not successfully suspended.

At operation, 530, the processing logic determines whether the requested data associated with the read operation is present in cache register 242 of page cache 240 of memory device 130. When data is programmed to memory device 130, that data can be first written to cache register 242, before being passed to one of data registers 244-246, and eventually programmed to memory array 250. Accordingly, if the read operation identifies data that was recently programmed to the memory device 130, that data may be available in cache register 242. In one embodiment, suspend manager 114 reads the data in cache register 242 to determine whether that data corresponds to the requested read data.

In response to determining that the data corresponding to the read operation is present in cache register 242, at operation 535, the processing logic reads the data corresponding to the read operation directly from cache register 242 and sends the data corresponding to the read operation to the host system 120. At operation 540, the processing logic identifies any additional requests to perform read operations on memory device 130 that are pending and can be processed while the program operation is suspended, and returns to operation 430 to perform those read operations.

In response to determining that the data corresponding to the read operation is not present in cache register 242, at operation 545, the processing logic determines whether the data corresponding to the read operation is present in one of data registers 244-246 of page cache 240. During a read operation, the requested data is read from memory array 250 into one of data registers 244-246, and then eventually into cache register 242. In addition, depending on the programming scheme, different pages of a memory cell can be programmed in different programming passes. Thus, prior to programming certain pages in a subsequent programming pass, data from other pages programmed in a prior programming pass is first read from memory array 250 and stored in one of data registers 244-246 in page cache 240. In one embodiment, the processing logic can read the data registers 244-246 to determine if the requested read data is present there.

In response to determining that the data corresponding to the read operation is present in one of data registers 244-246, at operation 550, the processing logic can copy the data corresponding to the read operation from the data register to cache register 242. Suspend manager 114 can read the requested data directly from cache register 242 and return the data to host system 120. In response to determining that the data corresponding to the read operation is not present in one of data registers 244-246, at operation 555, the processing logic performs the read operation on memory array 250 of memory device 130.

Figure 6:
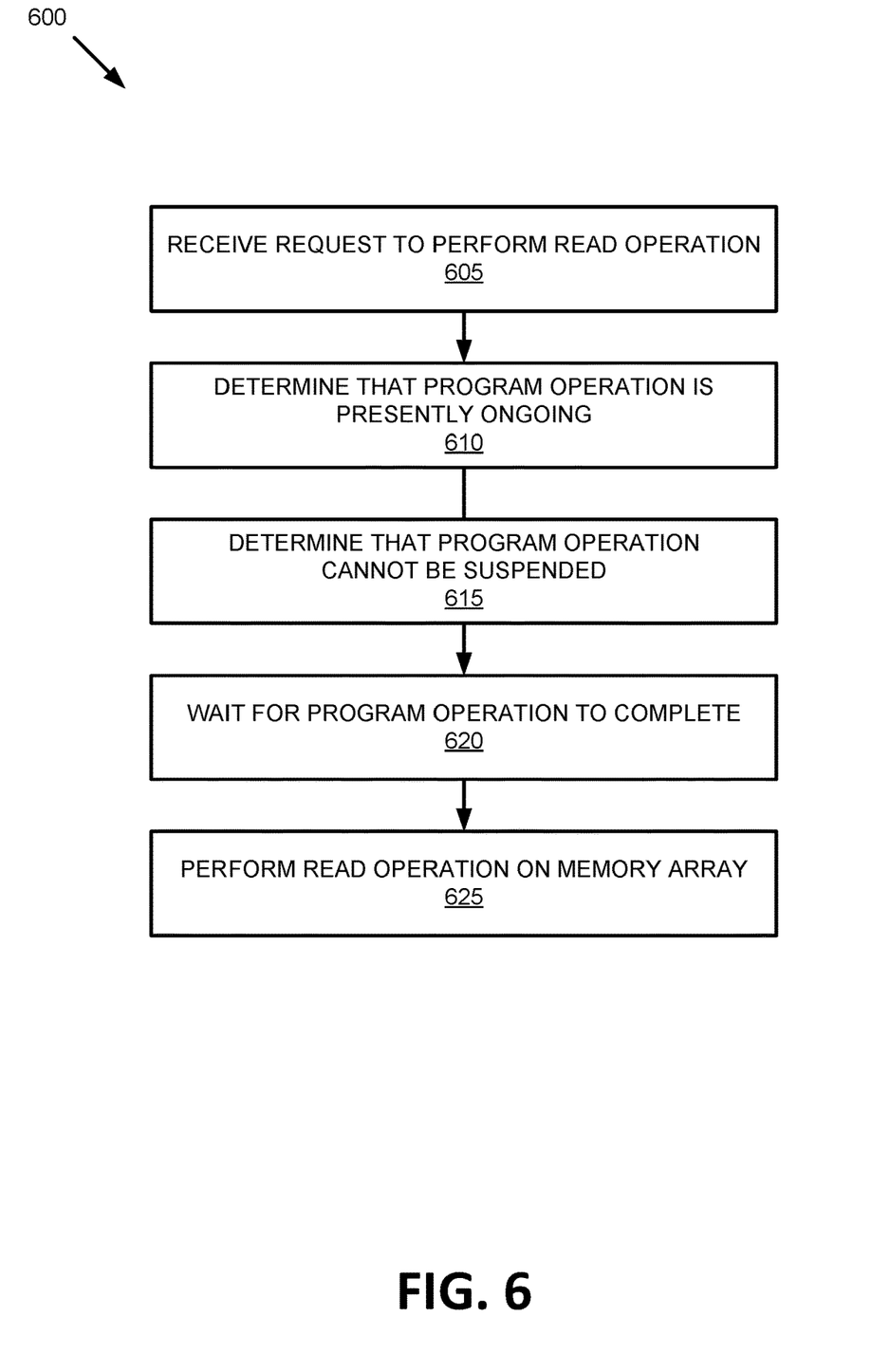
FIG. 6 is a flow diagram of an example method of read operation processing when an ongoing program operation on a shared wordline of a memory device cannot be suspended in accordance with some embodiments of the present disclosure.

FIG. 6 is a flow diagram of an example method of read operation processing when an ongoing program operation on a shared wordline of a memory device cannot be suspended in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by memory interface 113 and suspend manager 114 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing logic receives a request to perform a read operation on memory device 130. In one embodiment, memory sub-system controller 115 receives the request from host system 120 or from some other component connected to or within memory sub-system 110. The request may identify or include data to be read from memory device 130 of memory sub-system 110. In one embodiment, the read operation is a media management related read operation and is not initiated by host system 120. At operation 610, the processing logic determines that a program operation is presently ongoing on memory device 130.

At operation 615, the processing logic determines that the program operation cannot be suspended. In one embodiment, suspend manager 114 determines an expected program time associated with the program operation. The expected program time can be related to the type of memory cells being programmed. For example, SLC memory can be programmed very quickly compared to TLC or QLC memory. Accordingly, if the wordline 252 includes memory cells configured as SLC, suspend manager 114 may not suspend the program operation and can let the program operation finish execution since the expected program time is very short. If, however, the wordline 252 includes memory cells configured as TLC or QLC memory, suspend manger 114 can suspend the program operation since the expected program time is much longer.

In response to determining that the program operation cannot be suspended, at operation 620, the processing logic waits for the program operation to complete. At operation 625, the processing logic performs the read operation on memory array 250 of memory device 130.

Figure 7:
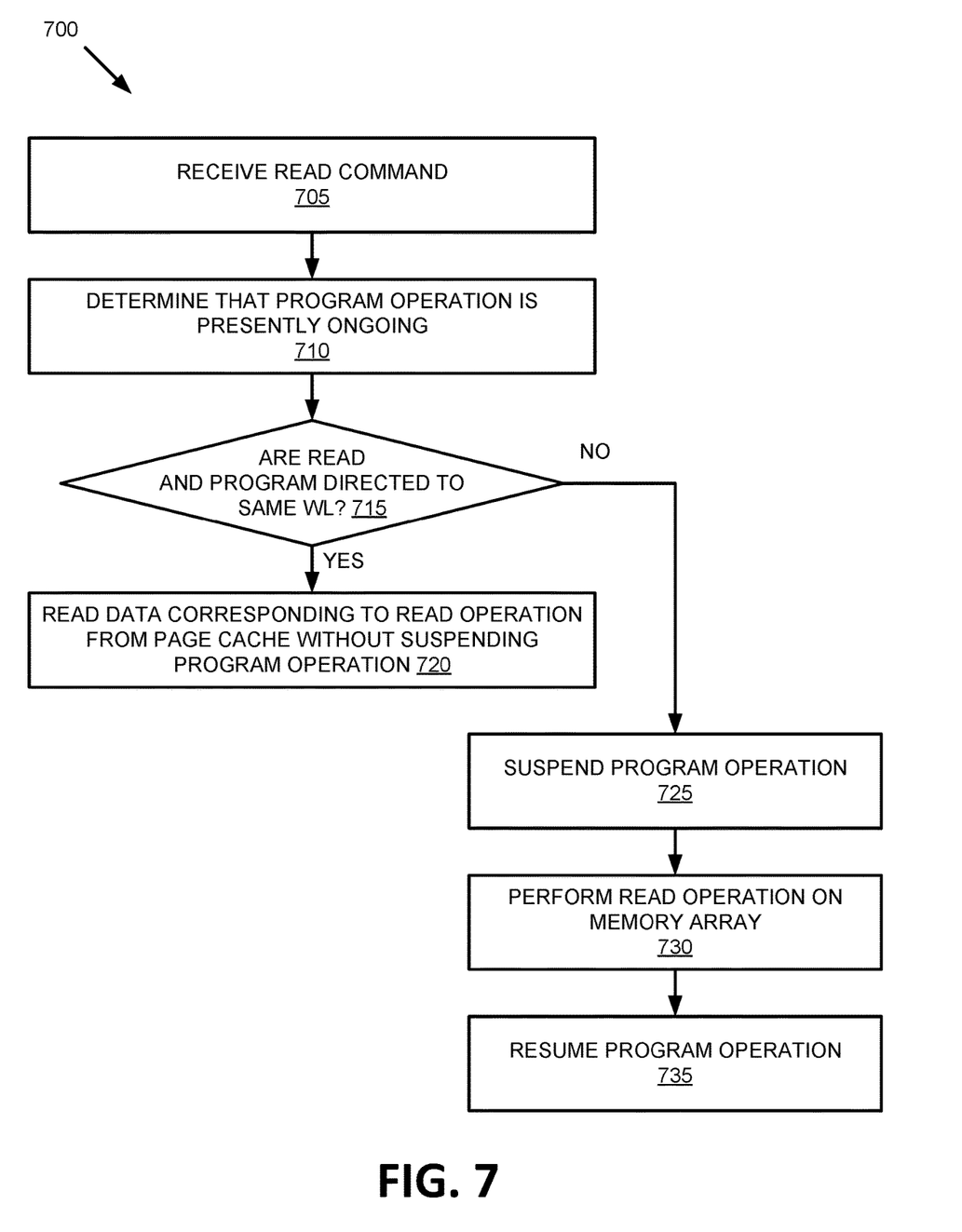
FIG. 7 is a flow diagram of an example method of read and program collision management on a shared wordline of a memory device in accordance with some embodiments of the present disclosure.

FIG. 7 is a flow diagram of an example method of read and program collision management on a shared wordline of a memory device in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by memory device 130 and/or local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, the processing logic receives a read command associated with a read operation. In one embodiment, memory device 130 receives the read command from memory interface 113 or some other component of memory sub-system controller 115. The read command can include instructions to cause the memory device 130 to perform the read operation for data stored at a specified memory address. In one embodiment, the read command is associated with a media management related read operation and is not initiated by host system 120.

At operation 710, the processing logic determines that a program operation is currently on-going on memory device 130. At operation 715, the processing logic determines whether the read operation and the program operation are directed to a same wordline and sub-block of memory array 250 of memory device 130. In one embodiment, memory device 130 includes a physical page map for each data block. When a physical address index of a page read operation and a physical address of a page being programmed are input to the page map, the output is a cache hit if both pages are on the same physical wordline, such as wordline 252.

In response to determining that the read operation and the program operation are directed to the same wordline and sub-block, at operation 720, the processing logic reads data corresponding to the read operation from page cache 240 of memory device 130 while the program operation is ongoing. As described above, as part of the program operation, certain previously programmed data can be temporarily stored in page cache 240. When the requested data corresponding to the read operation includes at least a portion of the one or more previously programmed pages, suspend manager 114 can read that data directly from the page cache 240 without having to access memory array 250. In addition, the data being programmed as part of the program operation can also be temporarily stored in the page cache 240 while it is being written to the memory array. Thus, when the read operation and the program operation are directed to the same wordline and sub-block, data can be read directly from the page cache 240 and returned to memory interface 113.

In response to determining that the read operation and the program operation are not directed to the same wordline and sub-block, at operation 725, the processing logic suspends the program operation. In one embodiment, memory device 130 can temporarily pause, halt, or otherwise stop execution of the on-going program operation, without receiving a specific command or instruction from memory sub-system controller 115. At operation 730, the processing logic reads the data corresponding to the read operation from memory array 250. At operation 735, the processing logic resumes the program operation after the read operation is completed. In one embodiment, memory device 130 can resume, restart, or otherwise continue execution of the suspended program operation.

Figure 8:
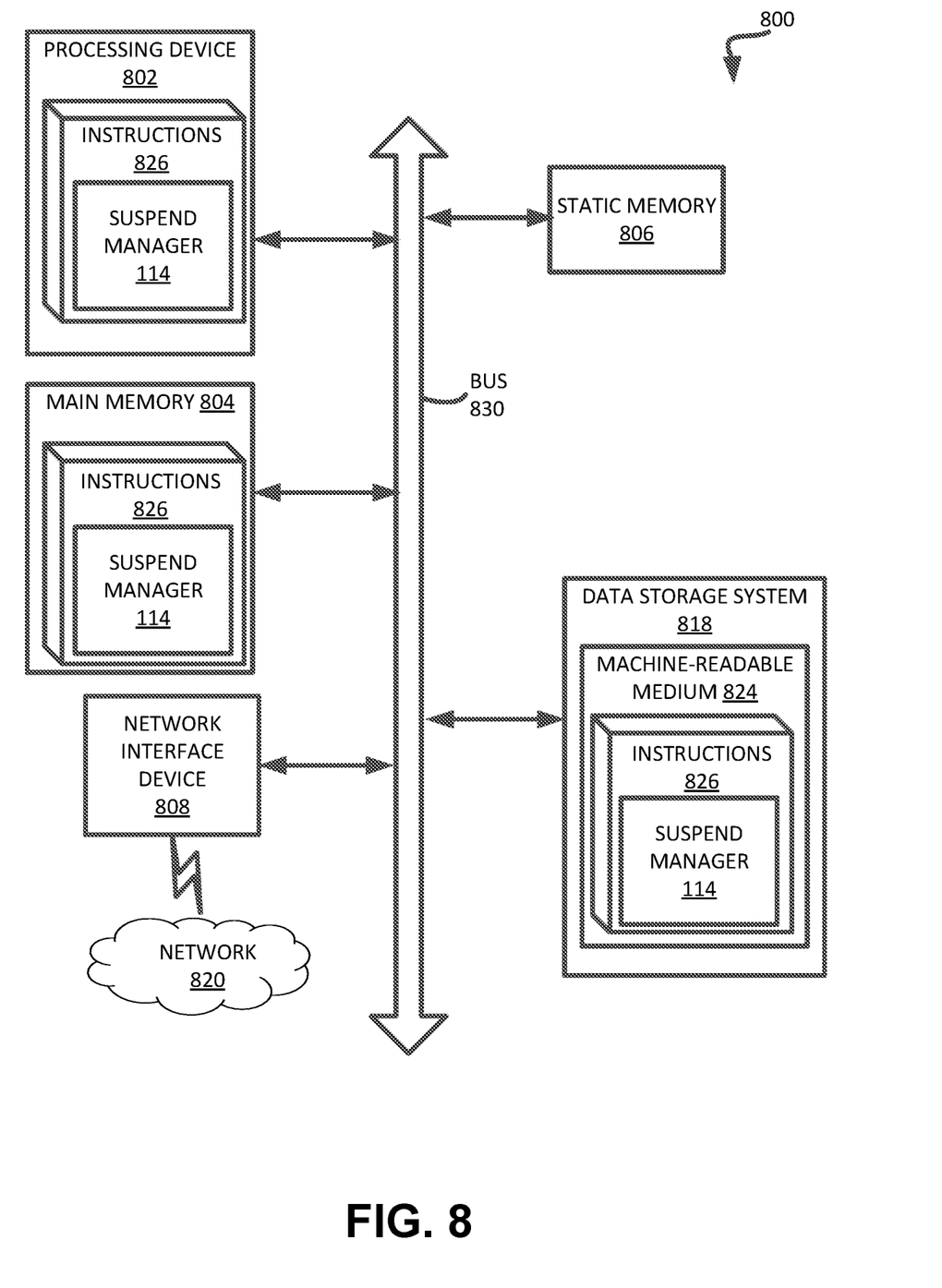
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to DMA controller 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to DMA controller 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
determining that a request to perform a read operation is directed to data stored on a same wordline and sub-block of the memory array on which a program operation is being performed;
responsive to determining that the request to perform the read operation is directed to data stored on the wordline and sub-block of the memory array on which the program operation is being performed, sending a suspend command to the memory device to cause the memory device to suspend the program operation; and
reading data corresponding to the read operation from a page cache of the memory device while the program operation is suspended.

2. The system of claim 1, wherein to perform the program operation, the processing device is configured to:
read one or more previously programmed pages from the same wordline and sub-block of the memory array; and
store the one or more previously programmed pages in the page cache of the memory device.

3. The system of claim 2, wherein the data corresponding to the read operation comprises at least a portion of the one or more previously programmed pages.

4. The system of claim 1, wherein the processing device is to perform operations further comprising:
determining whether the program operation can be suspended; and
in response to determining that the program operation cannot be suspended, reading the data corresponding to the read operation after the program operation is complete.

5. The system of claim 1, wherein the processing device is to perform operations further comprising:
determining whether the data corresponding to the read operation is present in a cache register of the page cache;
in response to determining that the data corresponding to the read operation is present in the cache register, reading the data corresponding to the read operation from the cache register; and
sending the data corresponding to the read operation to a host system.

6. The system of claim 5, wherein the processing device is to perform operations further comprising:
in response to determining that the data corresponding to the read operation is not present in the cache register, determining whether the data corresponding to the read operation is present in a data register of the page cache; and
in response to determining that the data corresponding to the read operation is present in the data register, copying the data corresponding to the read operation from the data register to the cache register.

7. The system of claim 6, wherein the processing device is to perform operations further comprising:
in response to determining that the data corresponding to the read operation is not present in the data register, performing the read operation on the memory array of the memory device.

8. A method comprising:
determining that a request to perform a read operation is directed to data stored on a same wordline and sub-block of a memory array of a memory device on which a program operation is being performed;
responsive to determining that the request to perform the read operation is directed to data stored on the wordline and sub-block of the memory array on which the program operation is being performed, sending a suspend command to the memory device to cause the memory device to suspend the program operation; and
reading data corresponding to the read operation from a page cache of the memory device while the program operation is suspended.

9. The method of claim 8, wherein, in response to the program command, the memory device is configured to:
read one or more previously programmed pages from the same wordline and sub-block of the memory array; and
store the one or more previously programmed pages in the page cache of the memory device.

10. The method of claim 9, wherein the data corresponding to the read operation comprises at least a portion of the one or more previously programmed pages.

11. The method of claim 8, further comprising:
determining whether the program operation can be suspended; and
in response to determining that the program operation cannot be suspended, reading the data corresponding to the read operation after the program operation is complete.

12. The method of claim 8, further comprising:
determining whether the data corresponding to the read operation is present in a cache register of the page cache;
in response to determining that the data corresponding to the read operation is present in the cache register, reading the data corresponding to the read operation from the cache register; and
sending the data corresponding to the read operation to a host system.

13. The method of claim 12, further comprising:
in response to determining that the data corresponding to the read operation is not present in the cache register, determining whether the data corresponding to the read operation is present in a data register of the page cache; and
in response to determining that the data corresponding to the read operation is present in the data register, copying the data corresponding to the read operation from the data register to the cache register.

14. The method of claim 13, further comprising:
in response to determining that the data corresponding to the read operation is not present in the data register, performing the read operation on the memory array of the memory device.

15. A non-transitory computer-readable storage medium storing instructions which, when executed by a processing device, cause the processing device to perform operations comprising:
determining that a request to perform a read operation is directed to data stored on a same wordline and sub-block of a memory array of a memory device on which a program operation is being performed;
responsive to determining that the request to perform the read operation is directed to data stored on the wordline and sub-block of the memory array on which the program operation is being performed, sending a suspend command to the memory device to cause the memory device to suspend the program operation; and
reading data corresponding to the read operation from a page cache of the memory device while the program operation is suspended.

16. The non-transitory computer-readable storage medium of claim 15, wherein to perform the program operation, the processing device is configured to:
read one or more previously programmed pages from the same wordline and sub-block of the memory array; and
store the one or more previously programmed pages in the page cache of the memory device.

17. The non-transitory computer-readable storage medium of claim 16, wherein the data corresponding to the read operation comprises at least a portion of the one or more previously programmed pages.

18. The non-transitory computer-readable storage medium of claim 15, wherein the instructions cause the processing device to perform operations further comprising:
determining whether the program operation can be suspended; and
in response to determining that the program operation cannot be suspended, reading the data corresponding to the read operation after the program operation is complete.

19. The non-transitory computer-readable storage medium of claim 15, wherein the instructions cause the processing device to perform operations further comprising:
determining whether the data corresponding to the read operation is present in a cache register of the page cache;
in response to determining that the data corresponding to the read operation is present in the cache register, reading the data corresponding to the read operation from the cache register; and
sending the data corresponding to the read operation to a host system.

20. The non-transitory computer-readable storage medium of claim 19, wherein the instructions cause the processing device to perform operations further comprising:
in response to determining that the data corresponding to the read operation is not present in the cache register, determining whether the data corresponding to the read operation is present in a data register of the page cache; and
in response to determining that the data corresponding to the read operation is present in the data register, copying the data corresponding to the read operation from the data register to the cache register.

* * * * *